US012684912B2

(12) United States Patent
Takemasa et al.

(10) Patent No.: US 12,684,912 B2
(45) Date of Patent: Jul. 14, 2026

(54) METHOD OF MANUFACTURING ELECTRONIC DEVICE, AND SUBSTRATE FOR ELEMENT TRANSFER

(71) Applicant: Japan Display Inc., Tokyo (JP)

(72) Inventors: Kenichi Takemasa, Tokyo (JP); Kazuyuki Yamada, Tokyo (JP); Keisuke Asada, Tokyo (JP); Daiki Isono, Tokyo (JP)

(73) Assignee: Japan Display Inc., Tokyo (JP)

( * ) Notice: Subject to any disclaimer, the term of this patent is extended or adjusted under 35 U.S.C. 154(b) by 442 days.

(21) Appl. No.: 18/470,478

(22) Filed: Sep. 20, 2023

(65) Prior Publication Data

US 2024/0105884 A1 Mar. 28, 2024

(30) Foreign Application Priority Data

Sep. 22, 2022 (JP) ................................ 2022-151950

(51) Int. Cl.
| | |
|---|---|
| *H01L 33/48* | (2010.01) |
| *H01L 25/075* | (2006.01) |
| *H01L 33/20* | (2010.01) |
| *H01L 33/62* | (2010.01) |
| *H10H 20/819* | (2025.01) |
| *H10H 20/85* | (2025.01) |
| *H10H 20/857* | (2025.01) |
| *H10W 90/00* | (2026.01) |
| *H10H 20/01* | (2025.01) |

(52) U.S. Cl.
CPC ...... *H10H 20/8506* (2025.01); *H10H 20/819* (2025.01); *H10H 20/857* (2025.01); *H10W 90/00* (2026.01); *H10H 20/0364* (2025.01)

(58) Field of Classification Search
CPC .... H10P 72/74; H10P 72/741; H10P 72/7428; H10P 72/7434; H10H 20/01; H10H 20/0364; H10H 20/857; H10H 20/8506; H10W 72/01357
See application file for complete search history.

(56) References Cited

U.S. PATENT DOCUMENTS

| | | | | |
|---|---|---|---|---|
| 9,087,764 | B2 * | 7/2015 | Chan | .................... H10H 20/018 |
| 9,685,421 | B2 * | 6/2017 | Aleksov | ............. H10P 72/3204 |
| 2022/0109081 | A1 | 4/2022 | Asada | |

FOREIGN PATENT DOCUMENTS

JP 2021-005632 A 1/2021

* cited by examiner

*Primary Examiner* — John A Bodnar
(74) *Attorney, Agent, or Firm* — Michael Best & Friedrich LLP

(57) ABSTRACT

Performance of an electronic device is improved. A substrate for transfer includes a substrate having a surface and made of a visible light transmitting material, and an elastic deformation portion fixed on the surface of the substrate, transmitting visible light, and made of an elastically deformable material. The elastic deformation portion includes a plurality of element holding portions, and a plurality of protrusions arranged at positions not overlapping with the plurality of element holding portions, and protruding higher than the plurality of element holding portions when the surface of the substrate is a reference plane.

7 Claims, 14 Drawing Sheets

METHOD OF MANUFACTURING ELECTRONIC DEVICE, AND SUBSTRATE FOR ELEMENT TRANSFER

CROSS-REFERENCE TO RELATED APPLICATION

The present application claims priority to Japanese Patent Application No. 2022-151950 filed on Sep. 22, 2022, the disclosure of which is incorporated herein by reference.

TECHNICAL FIELD OF THE INVENTION

The present invention relates to a method of manufacturing an electronic device, and a substrate for element transfer.

BACKGROUND OF THE INVENTION

There is a method of manufacturing an electronic device in which electronic components (elements) are transferred to a plurality of electrodes arranged on a substrate. For example, Japanese Patent Application Laid-open Publication No. 2021-5632 (Patent Document 1) describes a substrate for transfer including a plurality of protrusions protruding from a first surface of an elastic body, as a substrate for transfer for transferring microLED elements onto a substrate.

RELATED ART DOCUMENT

Patent Document

Patent Document 1: Japanese Patent Application Laid-open Publication No. 2021-5632

SUMMARY OF THE INVENTION

In a step of transferring elements onto a substrate, by laser irradiation in a state in which the elements are held at tips of a plurality of element holding portions, contact portions between bump electrodes on the substrate and element electrodes are heated to mount the elements onto the substrate. In a step of joining the elements and the bump electrodes together, electrical connection reliability can be achieved when the plurality of element electrodes and the plurality of bump electrodes are in contact with each other in an appropriate state of contact, respectively. Therefore, a technique capable of controlling the state of contact between the plurality of element electrodes and the plurality of bump electrodes with high accuracy is required.

An object of the present invention is to provide a technique improving performance of an electronic device.

A method of manufacturing an electronic device according to an embodiment includes: a step (a) of preparing a substrate for element transfer including a first substrate having a first surface, and an elastic deformation portion fixed on the first surface of the first substrate and made of an elastically deformable material; a step (b) of sticking a plurality of elements and a plurality of element holding portions of the elastic deformation portion of the substrate for element transfer to hold the plurality of elements using the substrate for element transfer; a step (c) of preparing a second substrate having a second surface having a plurality of bump electrodes arranged thereon, and bringing the plurality of bump electrodes and electrodes of the plurality of elements held by the substrate for element transfer into contact with each other; and a step (d) of irradiating with laser a plurality of contact portions at which the plurality of bump electrodes and the electrodes of the plurality of elements are in contact with each other to join the element electrodes and the bump electrodes irradiated with the laser together. The elastic deformation portion includes the plurality of element holding portions, and a plurality of protrusions arranged at positions not overlapping with the plurality of element holding portions in a plan view, and protruding higher than the plurality of element holding portions when the first surface of the first substrate is a reference plane. At the step (c), the first substrate and the second substrate are brought close to each other until each of the plurality of protrusions of the elastic deformation portion is brought into contact with the second surface of the second substrate.

A substrate for element transfer according to another embodiment includes: a first substrate having a first surface and made of a visible light transmitting material; and an elastic deformation portion fixed on the first surface of the first substrate, transmitting visible light, and made of an elastically deformable material. The elastic deformation portion includes: a plurality of element holding portions; and a plurality of protrusions arranged at positions not overlapping with the plurality of element holding portions in a plan view, and protruding higher than the plurality of element holding portions when the first surface of the first substrate is a reference plane.

BRIEF DESCRIPTIONS OF THE DRAWINGS

FIG. 14 is an enlarged cross-sectional view schematically showing a state of some of a plurality of contact portions shown in FIG. 11 being irradiated with laser.

DESCRIPTIONS OF THE PREFERRED EMBODIMENTS

Figure 1:
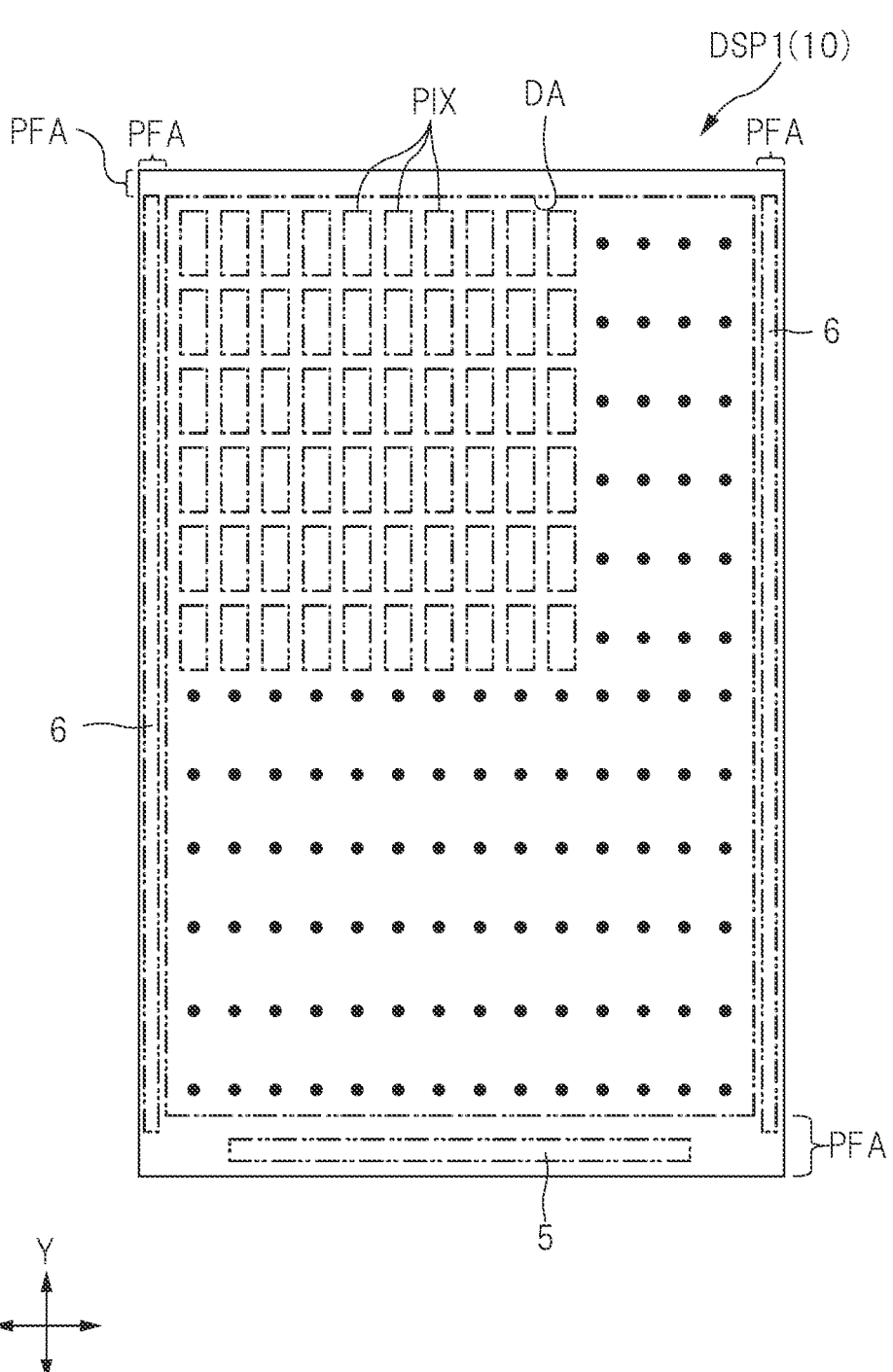
FIG. 1 is a plan view showing a configuration example of a microLED display device according to an embodiment of the electronic device.

The following is explanation for each embodiment of the present invention with reference to drawings. Note that only one example is disclosed, and appropriate modification with keeping the concept of the present invention which can be easily anticipated by those who are skilled in the art is obviously within the scope of the present invention. Also, in order to make the clear description, a width, a thickness, a shape, and others of each portion in the drawings are schematically illustrated more than those in an actual aspect in some cases. However, the illustration is only an example, and does not limit the interpretation of the present invention. In the present specification and each drawing, similar elements to those described earlier for the already-described drawings are denoted with the same or similar reference characters, and detailed description for them is appropriately omitted in some cases.

In the following embodiments, a microLED display device mounted with a plurality of microLED elements, and a bump electrode array device not yet mounted with the microLED elements will be exemplified and described as an example of an electronic device having a bump electrode array for mounting a plurality of electronic components.

<Electronic Device>

Figure 2:
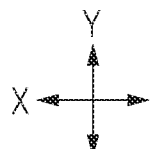
FIG. 2 is a circuit diagram showing a configuration example of a circuit around a pixel shown in FIG. 1.

First, a configuration example of a microLED display device that is an electronic device of the present embodiment will be described. FIG. 1 is a plan view showing a configuration example of a microLED display device according to an embodiment of the electronic device. In FIG. 1, each of a boundary between a display region DA and a peripheral region PFA, a control circuit 5, a drive circuit 6, and a plurality of pixels PIX is shown with a dashed double-dotted line. FIG. 2 is a circuit diagram showing a configuration example of a circuit around the pixel shown in FIG. 1.

As shown in FIG. 1, a display device DSP1 of the present embodiment includes the display region DA, the peripheral region PFA enclosing the display region DA in a frame form, and the plurality of pixels PIX arranged in a matrix within the display region DA. The display device DSP1 also includes a substrate 10, the control circuit 5 formed on the substrate 10, and the drive circuit 6 formed on the substrate 10. The substrate 10 is made of glass or resin. The substrate 10 has a surface 10*t* and a surface 10*b* opposite to the surface 10*f*.

The control circuit 5 is a control circuit that controls driving of a displaying function of the display device DSP1. For example, the control circuit 5 is a driver IC (integrated circuit) mounted on the substrate 10. In the example shown in FIG. 1, the control circuit 5 is placed along one short side among four sides of the substrate 10. In an example of the present embodiment, the control circuit 5 includes a signal line drive circuit that drives lines (video signal lines) VL (see FIG. 2) connected to the plurality of pixels PIX. However, the position and configuration example of the control circuit 5 are not limited to the example shown in FIG. 1, but there are various modification examples thereof. For example, in FIG. 1, a circuit board such as a flexible printed board may be connected to the position shown as the control circuit 5, and the above-described driver IC may be mounted on the circuit board. In addition, for example, the signal line drive circuit that drives the lines VL may be formed separately from the control circuit 5.

The drive circuit 6 includes a circuit that drives a scan signal line GL (see FIG. 2 described later) among the plurality of pixels PIX. The drive circuit 6 also includes a circuit that supplies a reference potential to an LED element mounted on each of the plurality of pixels PIX. The drive circuit 6 drives the plurality of scan signal lines GL based on a control signal from the control circuit 5. In the example shown in FIG. 1, the drive circuit 6 is arranged along each of two long sides among the four sides of the substrate 10. However, the position and configuration example of the drive circuit 6 are not limited to the example shown in FIG. 1, but there are various modification examples thereof. For example, in FIG. 1, a circuit board such as a flexible printed board may be connected to the position shown as the control circuit 5, and the above-described drive circuit 6 may be mounted on the circuit board.

Next, a configuration example of a circuit of the pixel PIX will be described with reference to FIG. 2. Note that four of the pixels PIX are shown as representatives in FIG. 2. However, each of the plurality of pixels PIX shown in FIG. 1 includes the same circuit as those of the pixels PIX shown in FIG. 2. Hereinafter, a circuit including a switch and an LED element 20 of the pixel PIX may be referred to below as a pixel circuit. The pixel circuit is a voltage signal type circuit that controls an emitting state of the LED element 20 in accordance with a video signal Vsg supplied from the control circuit 5 (see FIG. 1).

As shown in FIG. 2, the pixel PIX includes the LED element 20. The LED element 20 is a micro light-emitting diode described above. The LED element 20 includes an anode electrode 20EA and a cathode electrode 20EK. The cathode electrode 20EK of the LED element 20 is connected to a line VSL to which a reference potential (fixed potential) PVS is supplied. The anode electrode 20EA of the LED element 20 is electrically connected to a drain electrode ED of a switching element SW via a line 31.

The pixel PIX includes the switching element SW. The switching element SW is a transistor that controls a connection state (ON or OFF state) between the pixel circuit and the line VL in response to a control signal Gs. The switching element SW is, for example, a thin film transistor. When the switching element SW is turned ON, the video signal Vsg is input from the line VL to the pixel circuit.

The drive circuit 6 includes a shift resistor circuit, an output buffer circuit or the like, which are not illustrated. The drive circuit 6 outputs a pulse based on a horizontal scanning start pulse transmitted from the control circuit 5 (see FIG. 1), and outputs the control signal Gs.

Each of the plurality of scan signal lines GL extends in an X direction. The scan signal line GL is connected to a gate electrode of the switching element SW. When the control signal Gs is supplied to the scan signal line GL, the switching element SW is turned ON, and the video signal Vsg is supplied to the LED element 20.

<Peripheral Structure of LED Element>

Figure 3:
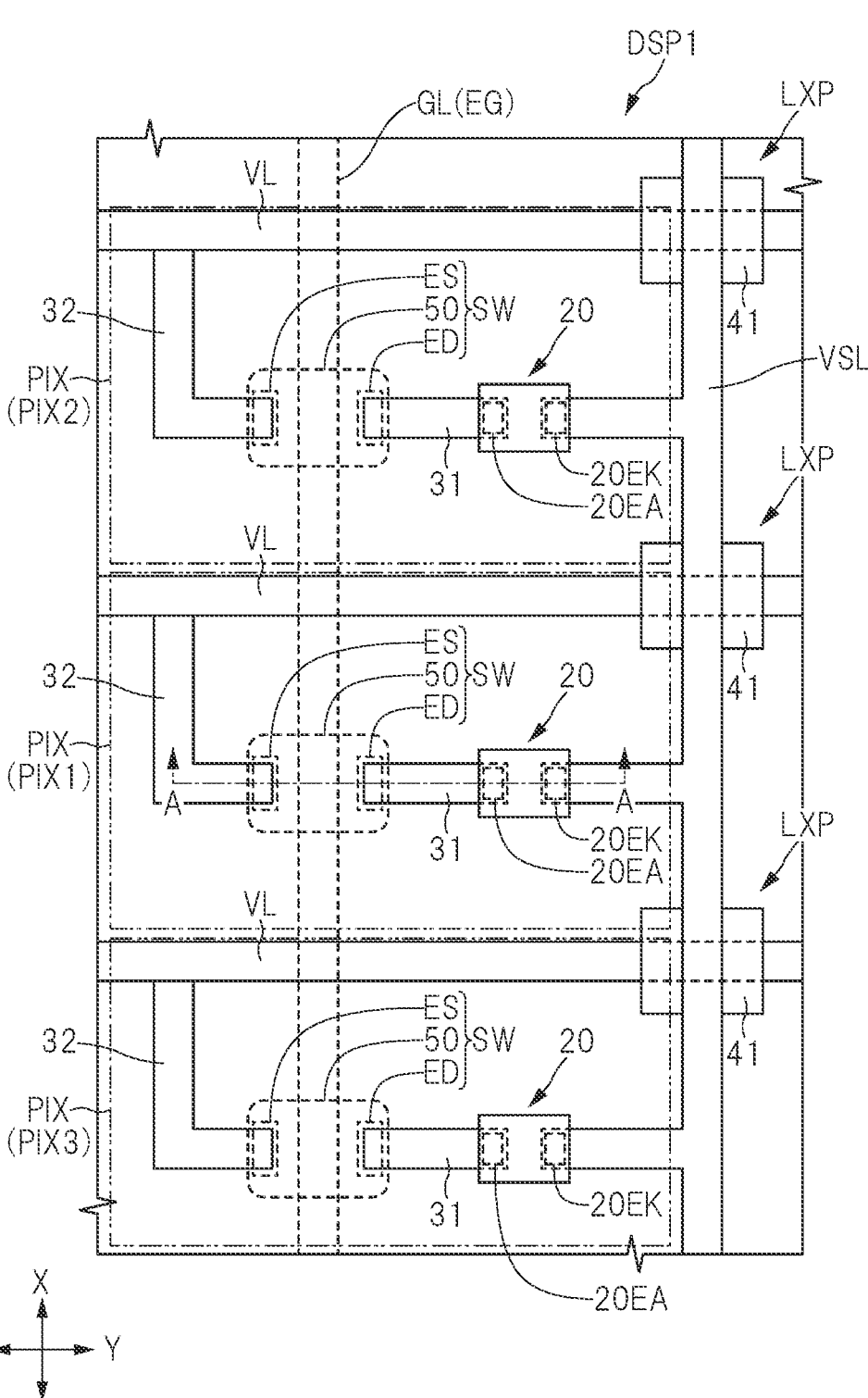
FIG. 3 is a transparent enlarged plan view showing an example of a peripheral structure of an LED element arranged in each of a plurality of pixels of the display device shown in FIG. 1.
Figure 4:
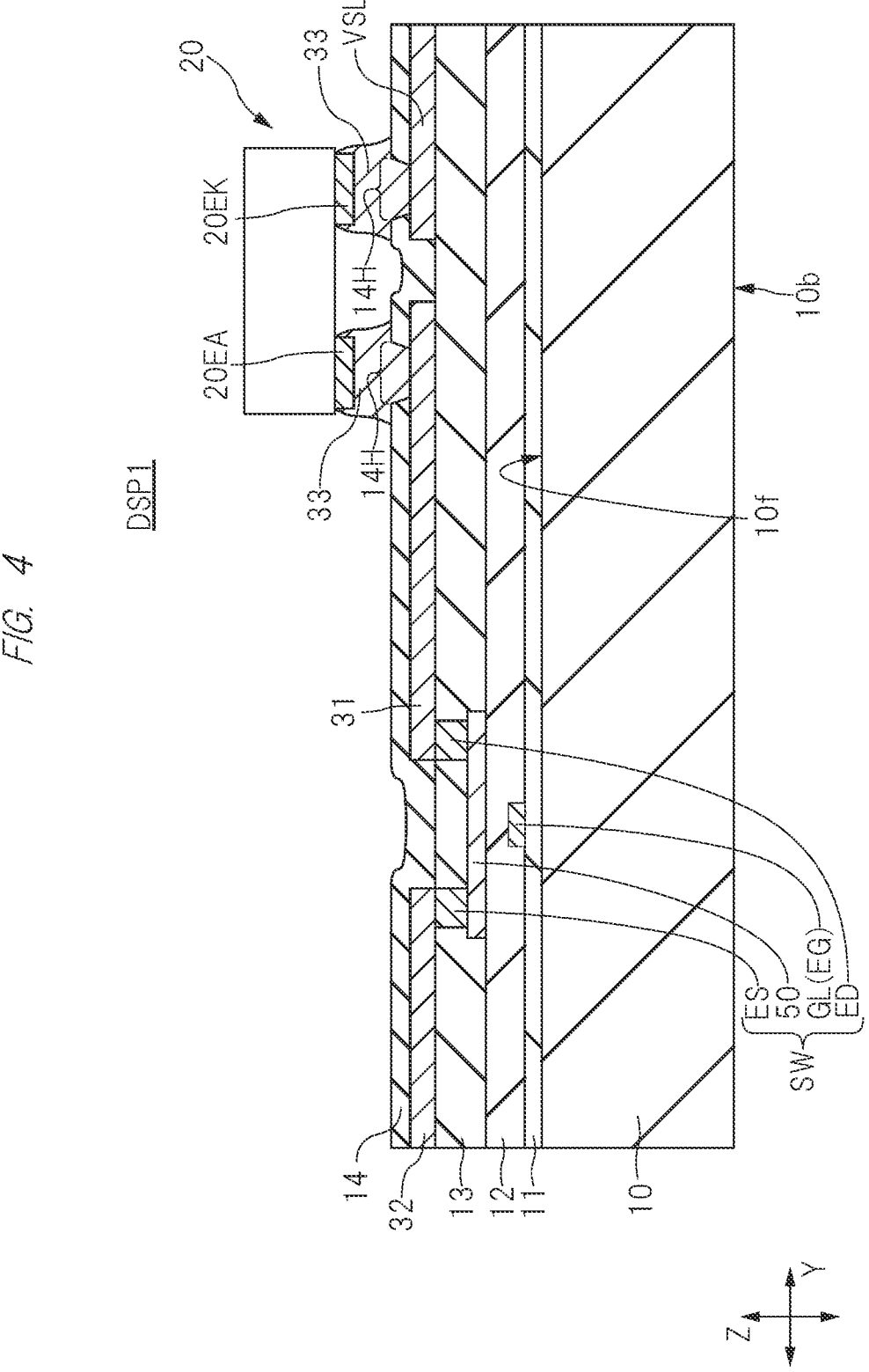
FIG. 4 is an enlarged cross-sectional view taken along a line A-A in FIG. 3.
Figure 5:
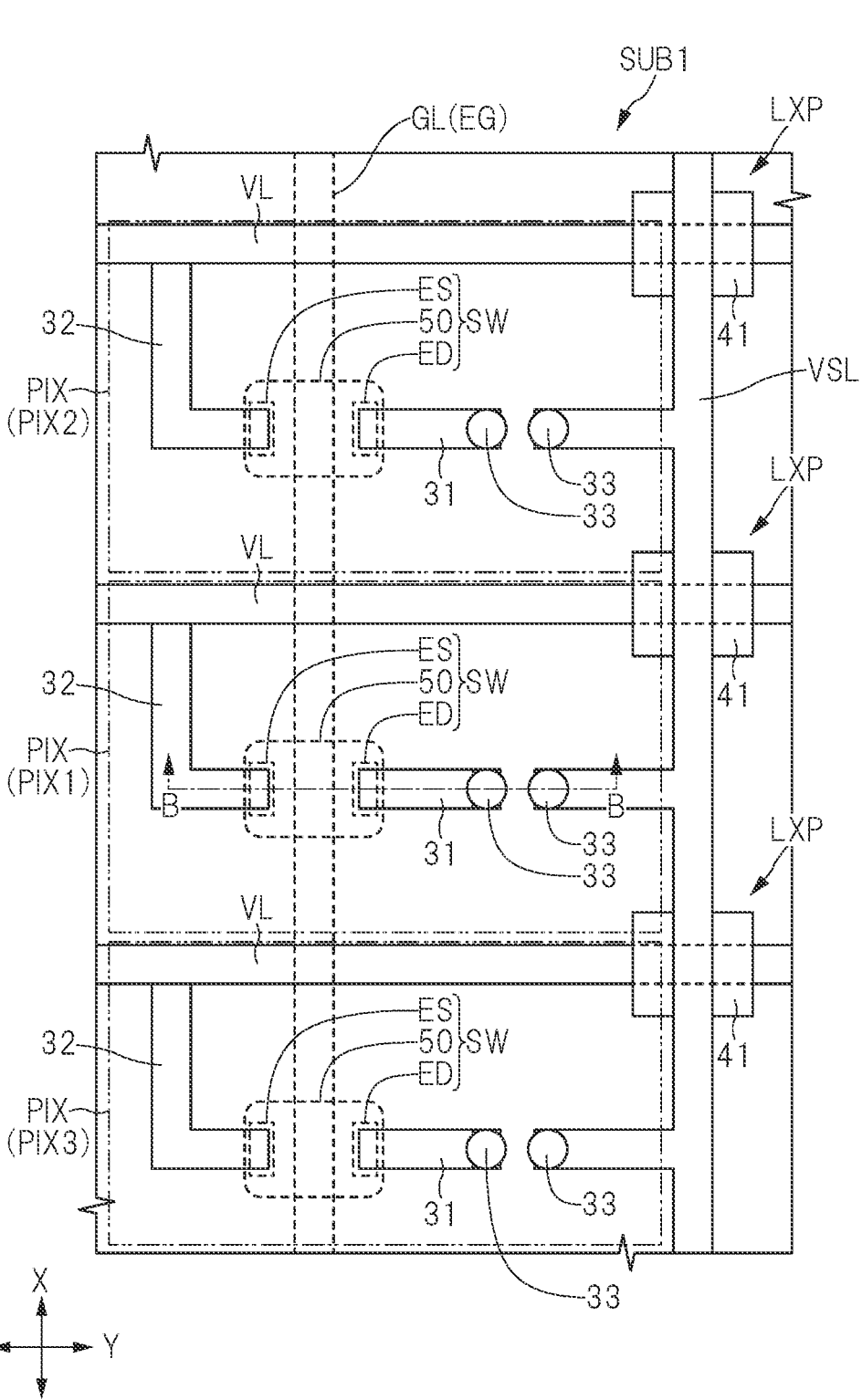
FIG. 5 is an enlarged plan view showing a substrate structure body without the LED element shown in FIG. 3.

Next, a peripheral structure of the LED element arranged in each of the plurality of pixels PIX shown in FIG. 1 will be described. FIG. 3 is a transparent enlarged plan view showing an example of the peripheral structure of the LED element arranged in each of the plurality of pixels of the display device shown in FIG. 1. In FIG. 3, illustration of an inorganic insulating layer 14 shown in FIG. 4 is omitted. In FIG. 3, each contour of a semiconductor layer, an electrode, and a scan signal line is shown with a dotted line. FIG. 4 is an enlarged cross-sectional view taken along a line A-A in FIG. 3. FIG. 5 is an enlarged plan view showing a substrate structure body without the LED element shown in FIG. 3.

As shown in FIG. 3, the display device DSP1 includes the plurality of pixels PIX (that are pixels PIX1, PIX2, and PIX3 in an example shown in FIG. 4) including the pixel PIX1. Each of the plurality of pixels PIX includes the switching element SW, the LED element (light-emitting element) 20, the line 31, and a line 32. In each of the pixels PIX1, PIX2, and PIX3, note that the LED element 20 that emits visible light of any one of colors such as red, green and blue is mounted, and the switching element SW that drives the LED element 20 is formed. Color display is achieved by controlling the output and timing of the visible light emitted from the LED elements of the pixels PIX1, PIX2, and PIX3. In combination of the plurality of pixels PIX that emit visible light of different colors from one another, the pixel PIX for each color may be referred to as a subpixel, and a set of the plurality of pixels PIX may be referred to as a pixel. In the present embodiment, a portion equivalent to the above-described subpixel is referred to as the pixel PIX.

The line 31 is electrically connected to both a drain electrode ED of the switching element SW and the anode electrode 20EA of the LED element 20. The line 32 is connected to a source electrode ES of the switching element SW. In the example shown in FIG. 3, the line 32 has a bent structure, and has one end connected to the source electrode ES of the switching element SW, and the other end connected to the line VL. The scan signal line GL is used as a gate electrode EG of the switching element SW.

The display device DSP1 further includes the line VL extending across the plurality of pixels PIX along a Y direction (see FIG. 2) and electrically connected to the line 32, and the line VSL extending across the plurality of pixels PIX along the X direction crossing (in FIG. 3, perpendicular to) the Y direction and electrically connected to the cathode electrode 20EK of the LED element 20. At a line crossing portion LXP shown in FIG. 3, the line VL and the line VSL cross each other via an insulating layer 41. Since the insulating layer 41 is interposed between the line VL and the line VSL, the line VL and the line VSL are electrically insulated from each other. Note that a layout shown in FIG. 3 is only an example, and there are various modification examples thereof. For example, one of modification examples of FIG. 3 may have a structure in which switching element SW has a gate electrode not illustrated while the gate electrode is connected to the scan signal line GL. In this modification example, the scan signal line GL may be arranged at a position not overlapping with a semiconductor layer 50.

As shown in FIG. 4, the display device DSP1 is an electronic device including the substrate 10 made of glass or resin, and a plurality of insulating layers stacked on the substrate 10. The plurality of insulating layers of the display device DSP1 include inorganic insulating layers 11, 12, 13, and 14 stacked on the substrate 10. The substrate 10 has the surface 10*f* and the surface 10*b* opposite to the surface 10*f*. Each of the inorganic insulating layers 11, 12, 13, and 14 is stacked on the surface 10*f* of the substrate 10.

The switching element SW includes the inorganic insulating layer 12 formed on the substrate 10, the semiconductor layer 50 formed on the inorganic insulating layer 12, the drain electrode ED connected to a drain region of the semiconductor layer 50, the source electrode ES connected to a source region of the semiconductor layer 50, and the inorganic insulating layer 13 covering the semiconductor layer 50. Each of the line 31 and the line 32 is a stacked film of, for example, a conductor layer made of titanium or a titanium alloy and a conductor layer made of aluminum or an aluminum alloy. A stacked film having an aluminum layer between titanium layers is referred to as a TAT stacked film.

The example shown in FIG. 4 is an example of a bottom-gate type in which the gate electrode EG lies between the semiconductor layer 50 and the substrate 10. In the case of the bottom-gate type, a portion of the inorganic insulating layer 12 lying between the gate electrode EG and the semiconductor layer 50 functions as a gate insulating layer. The inorganic insulating layer 12 also functions as a base layer for forming the semiconductor layer 50 thereon. Note that the position of the gate electrode EG is not limited to the example shown in FIG. 4, and may be of, for example, a top-gate type described later as a modification example.

A material configuring each of the inorganic insulating layers 11, 12, 13, and 14 is not particularly limited. For example, silicon oxide ($SiO_2$), silicon nitride (SiN), and the like can be exemplified. In addition, the semiconductor layer 50 is a semiconductor film in which, for example, a silicon film made of silicon is doped with a p-type or n-type conductive impurity.

Each of the source electrode ES and the drain electrode ED is a contact plug for establishing electrical contact with either the source region or the drain region of the semiconductor layer 50. As a material of the contact plug, for example, tungsten and the like can be exemplified. As a modification example of FIG. 4, note that a part of the line 31 and a part of the line 32 may be embedded in each contact hole formed in the inorganic insulating layer 13 for exposing the source region and the drain region of the semiconductor layer 50. In this case, the parts of the line 31 and the line 32 embedded in the contact holes are in contact with the semiconductor layer 50, and an interface of the contact between the line 31 and the semiconductor layer 50 and the line 32 and the semiconductor layer 50 can be regarded as the drain electrode ED and the source electrode ES, respectively.

In addition, as shown in FIG. 5, the display device DSP1 (see FIG. 3) includes a plurality of bump electrodes 33 arranged regularly in a plan view. The bump electrode 33 is a terminal for mounting an electronic component on the substrate 10 (see FIG. 4). In the case of the present embodiment, the bump electrode 33 is a terminal for mounting the LED element 20 shown in FIG. 4. Therefore, one of two bump electrodes is connected to the anode electrode 20EA of the LED element 20, and the other is connected to the cathode electrode 20EK of the LED element 20. Therefore, in the case of the present embodiment, the plurality of bump electrodes 33 are arranged so that two of the bump electrodes 33 lie side by side in a region where the LED element 20 is to be mounted (see FIG. 3).

As shown in FIG. 4, the bump electrode 33 is connected to the line 31 at a position overlapping with an opening 14H formed in the inorganic insulating layer 14, and protrudes from the inorganic insulating layer 14. In addition, the bump electrode 33 is made of, for example, a solder containing tin. Alternatively, the bump electrode 33 may be a stacked body of a solder layer and a metal layer made of a metal material such as copper having a higher electrical conductivity than the solder.

<Method of Manufacturing Electronic Device>

Figure 6:
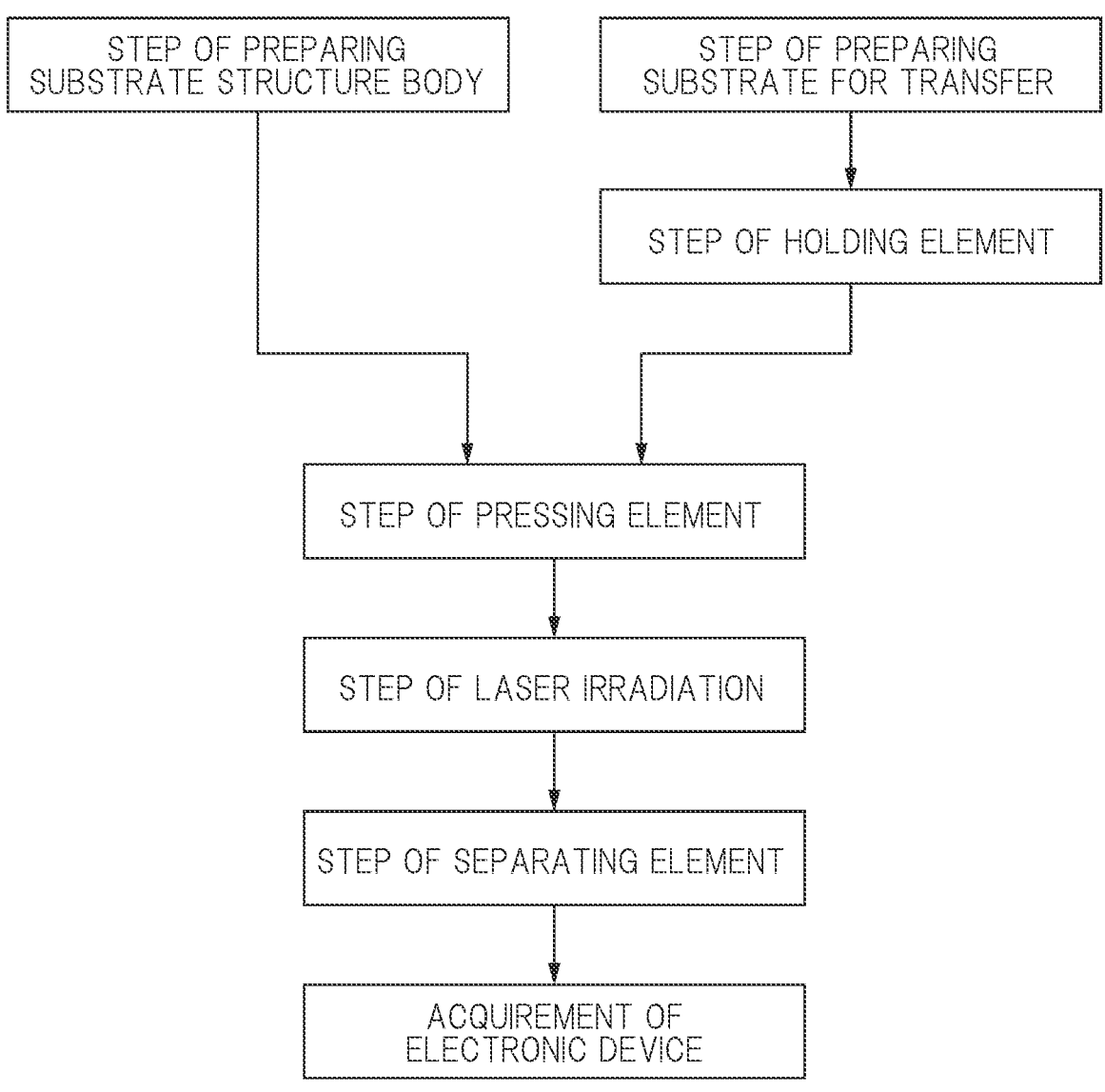
FIG. 6 is an explanatory diagram showing an example of a flow of steps of a method of manufacturing a display device according to an embodiment of the electronic device.

Next, a method of manufacturing an electronic device according to the present embodiment will be described as a representative example of a method of manufacturing the display device DSP1 shown in FIG. 3. Note that a step of forming the bump electrode 33 in the opening 14H shown in FIG. 4 will be mainly described below. FIG. 6 is an explanatory diagram showing an example of a flow of steps of the method of manufacturing the display device according to the embodiment of the electronic device.

As shown in FIG. 6, the method of manufacturing the electronic device according to the present embodiment includes a step of preparing the substrate structure body, a step of preparing the substrate for transfer, a step of holding the element, a step of pressing the element, a step of laser irradiation, and a step of separating the element.

Figure 7:
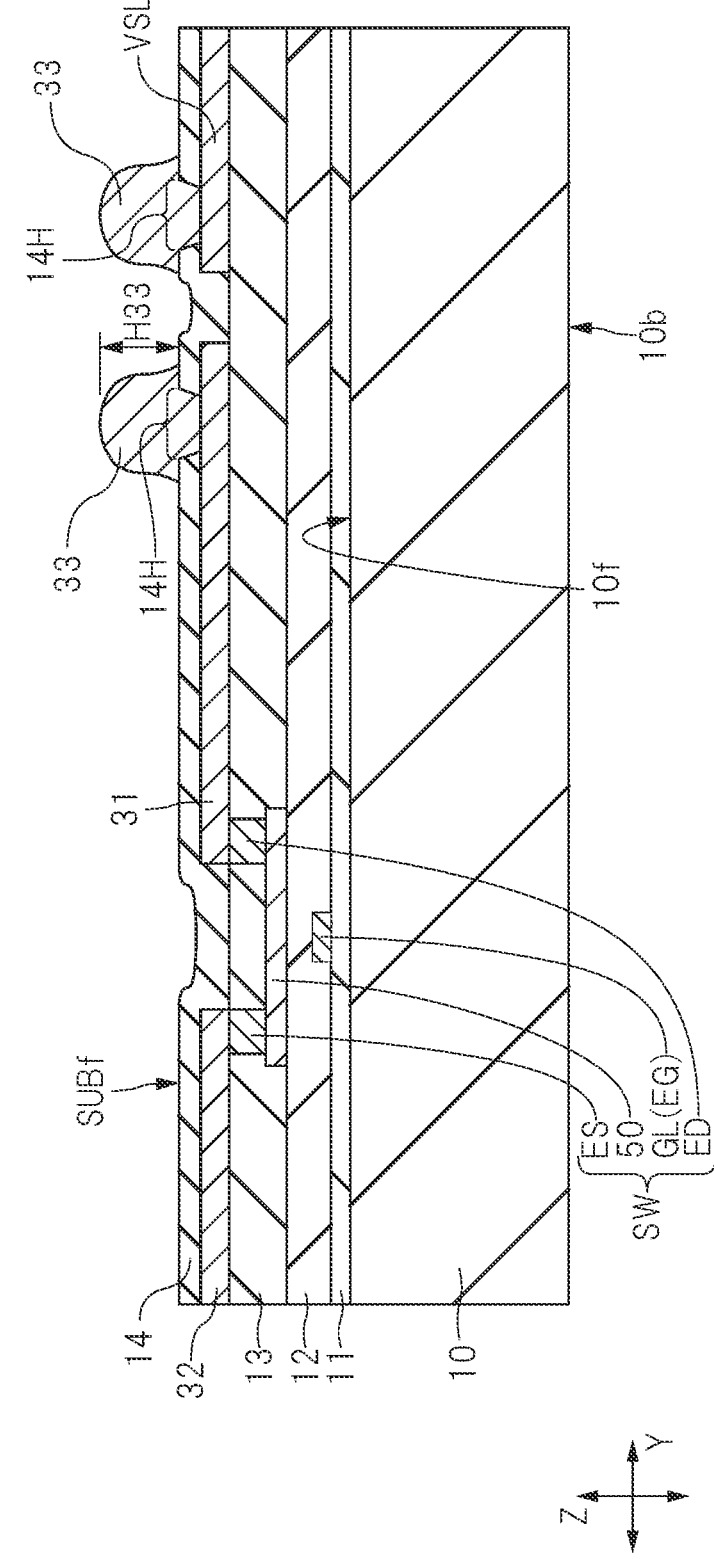
FIG. 7 is an enlarged cross-sectional view taken along a line B-B in FIG. 5.

At the step of preparing the substrate structure body as shown in FIG. 6, the substrate structure body SUB1 shown in FIG. 5 is prepared. FIG. 7 is an enlarged cross-sectional view taken along a line B-B in FIG. 5. As shown in FIG. 7, at the step of preparing the substrate structure body, the substrate structure body SUB1 including the substrate 10 made of glass or resin, the line 31 formed on the substrate 10, and the inorganic insulating layer 14 covering the line 31 is prepared. In an example shown in FIG. 7, the inorganic insulating layer 11, the inorganic insulating layer 12, the inorganic insulating layer 13, and the inorganic insulating layer 14 are stacked on the substrate 10, and the line 31 is arranged between the inorganic insulating layer 13 and the inorganic insulating layer 14. Most of the substrate structure body SUB1 is covered with the inorganic insulating layer 14. In the inorganic insulating layer 14, the openings 14H are formed at a position overlapping with the line 31 and at a position overlapping with the line VSL. At bottoms of the openings 14H, each of the line 31 and the line VSL is exposed from the inorganic insulating layer 14.

The plurality of bump electrodes 33 are arranged on a surface SUBf of the substrate structure body SUB1. Each of the plurality of bump electrodes 33 is embedded in the opening 14H, and is connected to the line 31 or the line VSL at the bottom of the opening 14H. As shown in FIG. 5, in a plan view, the plurality of bump electrodes 33 are regularly arranged in a region where an electronic component (the LED element 20 shown in FIG. 3) is to be mounted.

As shown in FIG. 7, the bump electrode 33 is so formed as to protrude upward from the inorganic insulating layer 14. Since the part of the line 31 and the part of the line VSL are partially exposed from the inorganic insulating layer 14 in the openings 14H as described above, the bump electrodes 33 can be selectively formed by, for example, an electroplating method. Note that the bump electrode 33 may be formed by using a resist film in order to increase a protruding height of the bump electrode 33.

Figures 8, 9:
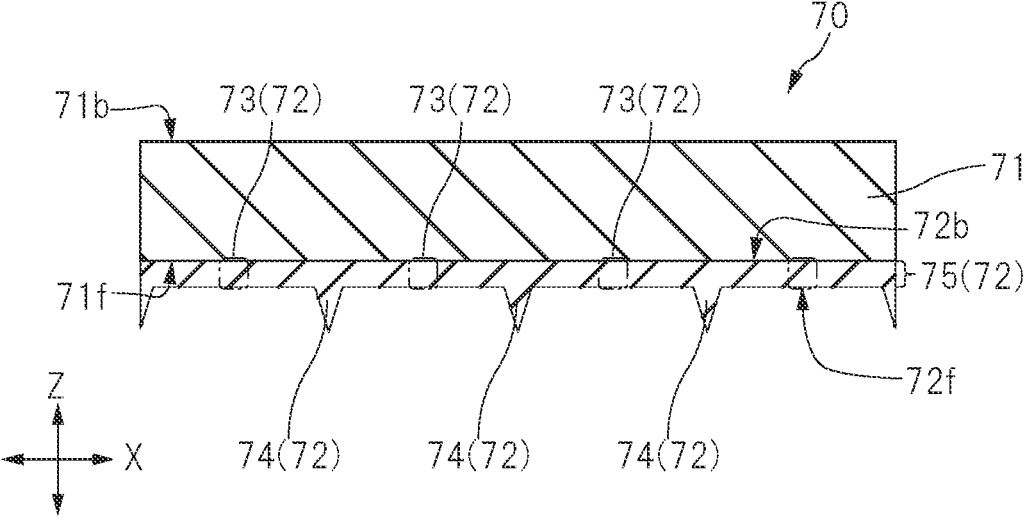
FIG. 8 is a plan view of a substrate for transfer prepared at a step of preparing a substrate for transfer shown in FIG. 6.
FIG. 9 is an enlarged cross-sectional view taken along a line C-C shown in FIG. 8.

Next, at the step of preparing the substrate for transfer as shown in FIG. 6, a substrate for transfer shown in FIG. 8 is prepared. FIG. 8 is a plan view of the substrate for transfer prepared at the step of preparing the substrate for transfer as shown in FIG. 6. FIG. 9 is an enlarged cross-sectional view taken along a line C-C in FIG. 8.

A substrate for transfer (a substrate for element transfer) 70 shown in FIGS. 8 and 9 includes a substrate 71 having a surface 71f and a surface 71b opposite to the surface 71f (see FIG. 9), and an elastic deformation portion 72 fixed on the surface 71f of the substrate 71. The elastic deformation portion 72 is bonded to the surface 71f of the substrate 71.

The substrate 71 is a support substrate for ensuring the rigidity of the substrate for transfer 70. The substrate 71 is a synthetic substrate mainly made of silicon oxide such as quartz, glass, or the like. In addition, the elastic deformation portion 72 is made of an elastically deformable elastic body. As examples of a material configuring the elastic deformation portion 72, for example, natural rubber (NR), silicone rubber (SI), polyurethane resin (PUR), fluoro rubber (FPM), and the like can be exemplified. Single type of these rubbers may be used, or combination of them may be used.

As shown in FIG. 9, the elastic deformation portion 72 includes a plurality of element holding portions 73 and a plurality of protrusions 74 arranged at positions not overlapping with the plurality of element holding portions 73, and protruding higher than the plurality of element holding portions 73 when the surface 71f of the substrate 71 is a reference plane. In an example shown in FIG. 9, the elastic deformation portion 72 includes a base portion 75 so formed as to entirely cover the surface 71f of the substrate 71, and a part of the base portion 75 functions as the element holding portion 73. In addition, the protrusion 74 is so formed as to protrude from the base portion 75. Each of the base portion 75 (including the plurality of element holding portions 73) and the plurality of protrusions 74, which configure the elastic deformation portion 72, is made of the same elastic material as one another to be uniformed.

The substrate 71 and a substrate bonding surface 72b of the elastic deformation portion 72 are bonded together via an adhesive. As the adhesive, for example, an acrylic-base resin, a polyester-base resin, a vinyl chloride-vinyl acetate copolymer resin, an ethylene-acrylic ester copolymer resin, an ethylene-methacrylic ester copolymer resin, a polyamide-base resin, a polyolefin-base resin, a chlorinated polyolefin-base resin, an epoxy-base resin, a urethane-base resin, or the like, can be used. Similarly, an adhesive layer for holding the element is arranged on an element holding surface 72f of the element holding portion 73 of the elastic deformation portion 72. For the adhesive layer, for example, the same adhesive as described above can be used. However, the element and the element holding portion 73 of the elastic deformation portion 72 need to be separated from each other after the element held by the element holding portion 73 of the elastic deformation portion 72 is mounted on the substrate 10, and therefore, the bonding strength of the adhesive layer bonded to the element is preferably lower than that of the adhesive for bonding the element holding portion 73 of the elastic deformation portion 72 and the substrate 71 together. As a modification example of the present embodiment, note that the elastic deformation portion 72 itself may be made of an adhesive resin as described above.

Figure 10:
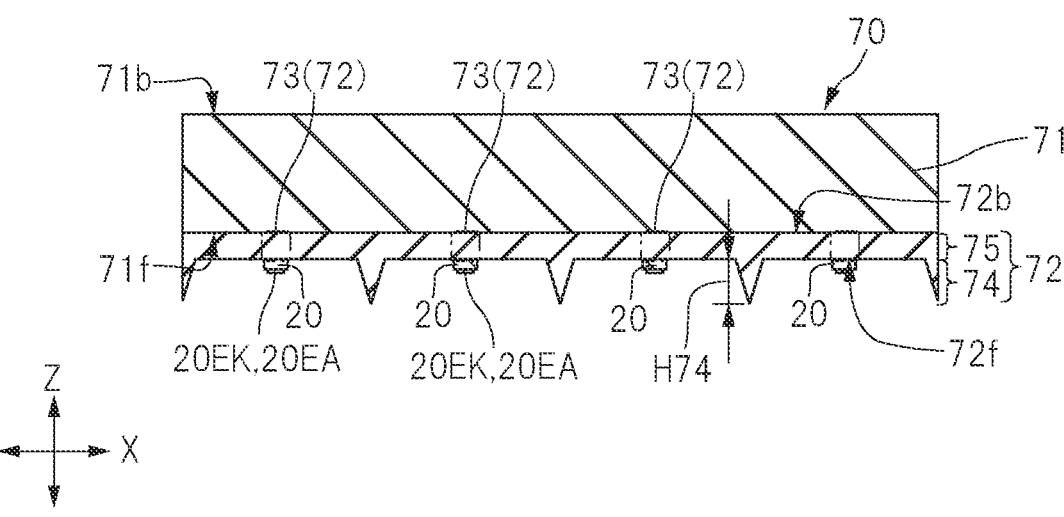
FIG. 10 is an enlarged cross-sectional view showing a state of elements held by element holding portions of the substrate for transfer shown in FIG. 9.

Next, at the step of holding the element as shown in FIG. 6, each of the plurality of element holding portions 73 of the elastic deformation portion 72 is made to hold the LED element as shown in FIG. 10. FIG. 10 is an enlarged cross-sectional view showing each of the element holding portions of the substrate for transfer shown in FIG. 9 holding the element. At the present step, the plurality of element holding portions 73 of the substrate for transfer 70 and the plurality of LED elements are bonded to each other so that the plurality of LED elements are held by the substrate for transfer 70. Specifically, a surface of the LED element 20, which is opposite to a surface thereof where the anode electrode 20EA and the cathode electrode 20EK are formed, is adhesively held by the element holding surface 72*f* of the element holding portion 73. In this manner, as shown in FIG. 11 next described, the plurality of anode electrodes 20EA and the plurality of cathode electrode 20EK can be made to face the substrate structure body SUB1.

Each of the plurality of LED elements 20 shown in FIG. 10 is formed on, for example, a sapphire substrate. Each of the plurality of LED elements 20 completed is transferred from the sapphire substrate to a first transfer substrate not illustrated, and then, is transferred from the first transfer substrate to the substrate for transfer 70 shown in FIG. 10. Because of the transfer from the sapphire substrate for forming each of the plurality of LED elements 20 to the substrate for transfer 70 via the first transfer substrate not illustrated, the anode electrode 20EA and the cathode electrode 20EK of the LED element are held at the position of the tip of the element holding portion 73 as shown in FIG. 10.

Figure 11:
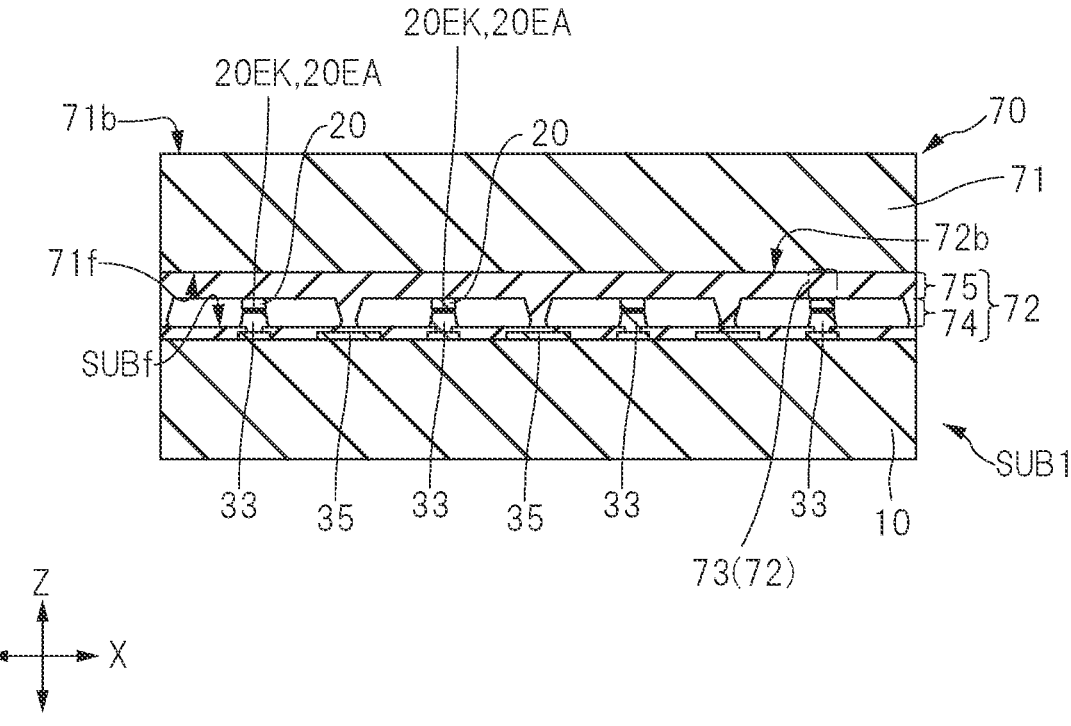
FIG. 11 is an enlarged cross-sectional view showing the substrate for transfer shown in FIG. 10 being pressed against the substrate structure body shown in FIG. 7.
Figure 12:
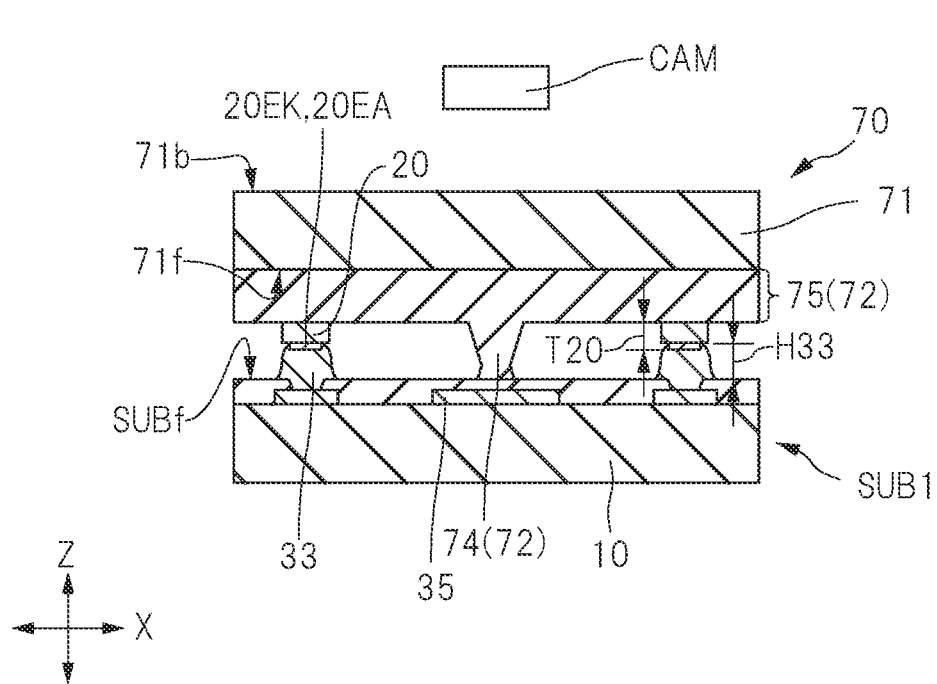
FIG. 12 is an enlarged cross-sectional view showing an elastically deforming state of a tip of a protrusion shown in FIG. 11 in contact with the substrate structure body.
Figure 13:
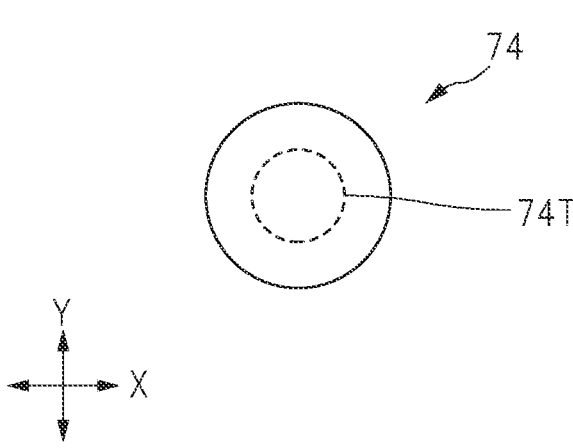
FIG. 13 is an enlarged plan view showing a deformed state of the tip of the protrusion shown in FIG. 12 being visually recognized from a back surface of the substrate for transfer.

Next, at the step of pressing the element as shown in FIG. 6, the substrate structure body SUB1 having the surface SUBf having the plurality of bump electrodes 33 arranged thereon is prepared, and the substrate for transfer 70 is pressed against the substrate structure body SUB1 as shown in FIG. 11. FIG. 11 is an enlarged cross-sectional view showing the state of the substrate for transfer shown in FIG. 10 being pressed against the substrate structure body shown in FIG. 7. FIG. 12 is an enlarged cross-sectional view showing an elastically deforming state of a tip of the protrusion shown in FIG. 11 in contact with the substrate structure body. FIG. 13 is an enlarged plan view showing a deformed state of the tip of the protrusion shown in FIG. 12 being visually recognized from a back surface of the substrate for transfer.

At the present step, the substrate for transfer 70 is pressed against the substrate structure body SUB1 in a state in which the plurality of bump electrodes 33 and the electrodes (the anode electrode 20EA and the cathode electrode 20EK) of the plurality of LED elements 20 held by the substrate for transfer 70 face each other. In this manner, the plurality of bump electrodes 33 and the electrodes (the anode electrode 20EA and the cathode electrode 20EK) of the plurality of LED elements 20 held by the substrate for transfer 70 are brought into contact with each other.

At the present step, when the LED element 20 is pressed against the substrate structure body SUB1 with an excessive force may cause damage to the LED elements 20. On the other hand, insufficient contact between the LED elements 20 and the bump electrodes 33 may cause degradation of reliability of an electrical connection between the LED elements 20 and the bump electrodes 33. Therefore, at the present step, it is necessary to control a distance between the substrate structure body SUB1 and the substrate for transfer 70 (specifically, a spacing distance between the substrate 10 and the substrate 71) to have an appropriate value. In the case of the present embodiment, the distance between the substrate structure body SUB1 and the substrate for transfer 70 (specifically, the spacing distance between the substrate 10 and the substrate 71) is controlled by each of the plurality of protrusions 74 of the elastic deformation portion 72. At the present step, the substrate for transfer 70 and the substrate structure body SUB1 are brought close to each other until the plurality of protrusions 74 of the elastic deformation portion 72 are in contact with positions not overlapping with the plurality of bump electrodes 33 on the substrate structure body SUB1.

In the case of the present embodiment, at the step of pressing the element, each of the tips of the plurality of protrusions 74 is elastically deformed to adjust the spacing distance between the substrate for transfer 70 and the substrate structure body SUB1, based on the degree of the elastic deformation of the tips. For example, in the case of the present embodiment, each of the plurality of protrusions 74 has a conical or pyramidal shape. FIG. 13 illustrates a case where each of them has the conical shape as example. Hereinafter, the conical or pyramidal shape is referred to as a "conical shape". The "conical shape" includes polygonal conical shapes such as triangular pyramid, quadrangular pyramid, and pentagonal pyramid or more conical shape. When the tip of the protrusion having the conical shape as in the present embodiment is elastically deformed, the tip of the protrusion 74 deforms to spread along a surface in contact with the tip, as shown in FIG. 12. Directions of the deformation of the tip spread isotropically in a plan view. Therefore, as illustrated in FIG. 13, a contour of a tip 74T of the protrusion 74 forms a circle.

Each of the substrate 71 and the elastic deformation portion 72 shown in FIG. 12 is made of a visible-light transmitting material. Therefore, when the protrusion 74 is imaged by an imager CAM arranged at the surface (back surface) 71*b* of the substrate 71 as illustrated in FIG. 12, such an image as illustrated in FIG. 13 is acquired. Note that FIG. 12 shows the example using the imager CAM. However, the image can also be visually checked. At the step of pressing the element, the shorter the distance between the substrate 71 and the substrate 10 shown in FIG. 12 is, the larger a size of the contour of the tip 74T shown in FIG. 13 is. Therefore, when a lower limit and an upper limit of the size of the contour of the tip 74T is preset, the degree of pressing can be controlled based on these set values. That is, the spacing distance between the substrate for transfer 70 and the substrate structure body SUB1 can be adjusted based on the degree of the elastic deformation of the tip 74T (see FIG. 13).

For example, if the size of the contour of each of the tips 74T (see FIG. 13) of the plurality of protrusions 74 shown in FIG. 11 is larger than the set upper limit, the spacing distance between the substrate for transfer 70 and the substrate structure body SUB1 is adjusted by entirely decreasing the force of pressing the substrate for transfer 70. On the other hand, if the size of the contour of the tip 74 is smaller than the set lower limit, the distance between the substrate for transfer 70 and the substrate structure body SUB1 is adjusted by entirely increasing the force of pressing the substrate for transfer 70. In addition, for example, if the sizes of the contours of the tips 74T of some of the plurality of protrusions 74 are larger than the set upper limit while the sizes of the contours of the tips 74T of others thereof are smaller than the set lower limit, this means that the substrate for transfer 70 and the substrate structure body SUB1 are not arranged in parallel. Therefore, the force of pressing the substrate for transfer 70 is adjusted while the sizes of the contours of the tips 74T illustrated in FIG. 13 are checked to arrange the substrate for transfer 70 and the substrate structure body SUB1 to be parallel.

As described above, according to the present embodiment, since the elastic deformation portion 72 is provided with the plurality of protrusions 74, the distance between the substrate for transfer 70 and the substrate structure body SUB1, in other words, the state of contact between the electrodes (the anode electrode 20EA and the cathode electrode 20EK) of the LED element and the bump electrodes 33, can be easily adjusted.

In addition, according to the present embodiment, each of the tips 74T (see FIG. 13) of the plurality of protrusions 74 is elastically deformed. Therefore, the spacing distance between the substrate for transfer 70 and the substrate structure body SUB1, in other words, the state of contact between the electrodes (the anode electrode 20EA and the cathode electrode 20EK) of the LED element 20 and the bump electrodes 33, can be accurately adjusted based on the degree of the elastic deformation of the tips 74T.

Various modification examples are applicable to the shape of the protrusion 74. For example, the shape of the protrusion 74 may be a conical frustum or pyramidal frustum shape that is a truncated conical shape. Alternatively, the shape of the protrusion 74 may be not the conical shape but a simple column shape or a rectangular column shape. However, in order to make the visual check for the sizes of the contours of the tips 74T easy, as shown in FIG. 13, each of the plurality of protrusions 74 is particularly preferred to have the conical or pyramidal shape.

In addition, in an example shown in FIG. 8, four protrusions 74 are arranged around each of the plurality of element holding portions 73 in a plan view. The number of protrusions 74 arranged around the element holding portion 72 has various modification examples. If the elastic deformation portion 72 includes at least two or more protrusions 74, the plurality of protrusions 74 and the substrate structure body SUB1 can be brought into contact with each other at the step of pressing the element. However, in order to enable accurately adjust the state of contact between the electrodes (the anode electrode 20EA and the cathode electrode 20EK) of the LED element and the bump electrodes 33, two or more of the protrusions 74 are preferably arranged around each of the plurality of element holding portions 73 in a plan view. In this case, the number of protrusions 74 is larger than the number of the element holding portions 73.

In addition, more than four of the protrusions 74 may be arranged around each of the plurality of element holding portions 73. However, as shown in FIG. 8, if four protrusions 74 are arranged around the element holding portion 73, the accurate adjustment can be sufficiently achieved. In addition, when the degree of the elastic deformation of each of the plurality of protrusions 74 is evaluated, the larger the number of protrusions 74 to be evaluated is, the longer time for the evaluation is. Therefore, the number of protrusions 74 arranged around each of the plurality of element holding portions 73 is particularly preferably about equal to or more than two and equal to or less than four.

A height H74 of the protrusion 74 shown in FIG. 10 is preferably within the following range. A height from the apex of the bump electrode 33 shown in FIG. 7 to the surface SUBf of the substrate structure body SUB1 is defined as a height H33 of the bump electrode 33. Note that the surface SUBf can be interpreted as a front surface of the substrate structure body SUB1 or a bump array surface. In addition, as shown in FIG. 12, a thickness of the LED element 20 including the electrodes is defined as a thickness T20. At this time, the height H74 of the protrusion 74 shown in FIG. 10 is preferably equal to or more than the sum of the thickness T20 of the LED element 20 and the height H33 of the bump electrode 33 shown in FIG. 12. In this manner, at the step of pressing the element shown in FIG. 6, the tip of the protrusion 74 can be brought into contact with the surface SUBf of the substrate structure body SUB1. In addition, the height H74 of the protrusion 74 is preferably equal to or less than "5 μm+the sum of the thickness T20 of the LED element and the height H33 of the bump electrode 33". If the height H74 of the protrusion 74 is within a range of "5 μm+the sum of the thickness T20 of the LED element 20 and the height H33 of the bump electrode 33", the interference of the contact between the electrodes of the LED element 20 and the bump electrodes 33 can be prevented by the protrusion 74.

The thickness T20 is about a few of μm to 10 μm. In addition, the height H33 is about a few of μm to 10 μm. A thickness of the base portion 75 is, for example, about a few tens of μm (for example, 20 μm). For example, if the thickness T20 is 10 μm while the height H33 of the bump electrode 33 is 3 μm, the height H74 of the protrusion 74 is particularly preferably equal to or more than 13 μm and equal to or less than 18 μm.

Figure 14:
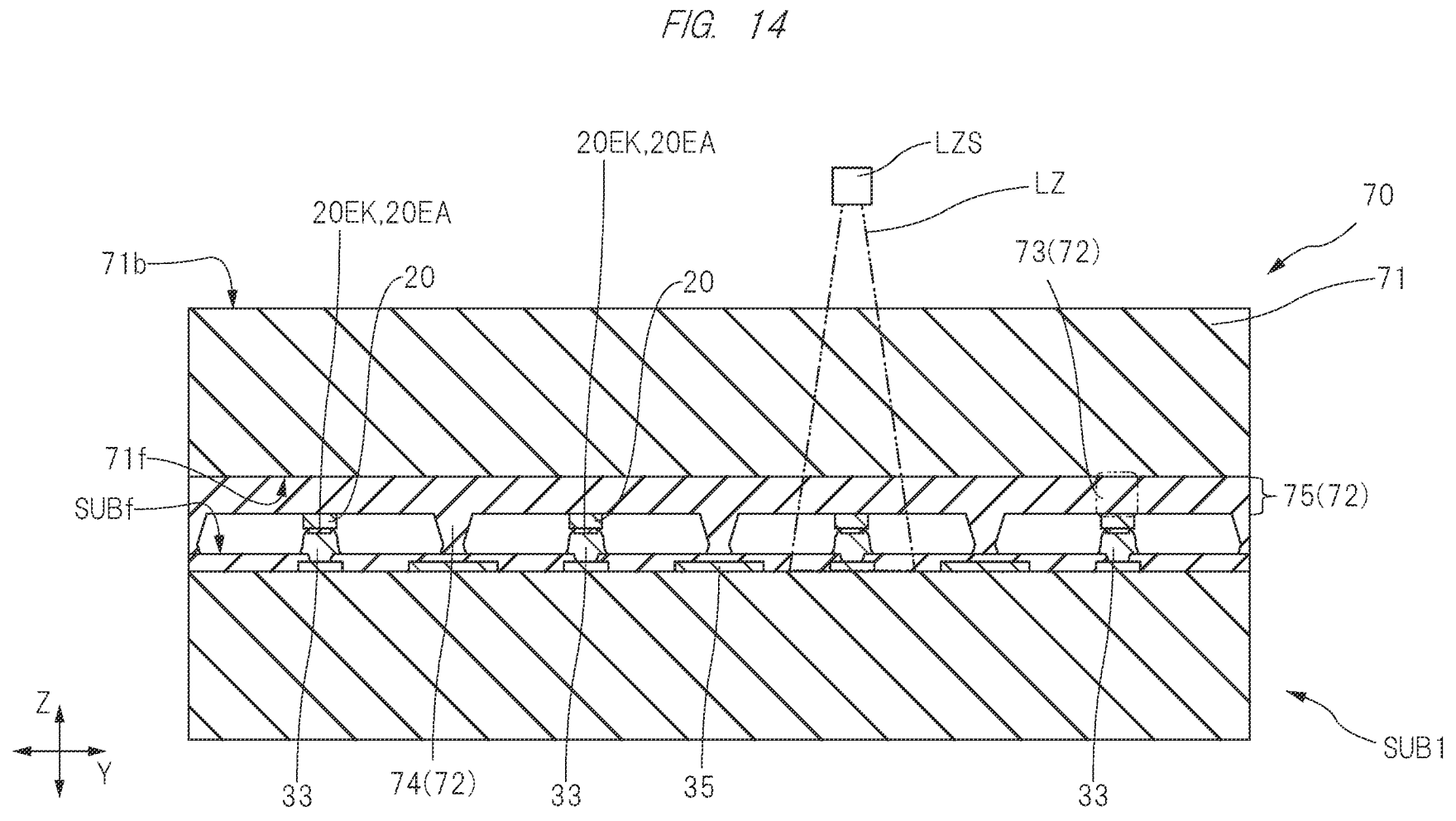

Next, at the laser irradiation step shown in FIG. 6, as shown in FIG. 14, some of a plurality of contact portions at which the plurality of bump electrodes 33 and the electrodes of the plurality of LED element 20 are in contact with each other are selectively irradiated with laser LZ to bond the electrodes of the LED elements 20 and the bump electrodes 33 irradiated with the laser LZ. FIG. 14 is an enlarged cross-sectional view schematically showing some of the plurality of contact portions shown in FIG. 11 being irradiated with the laser.

At the present step, the contact portion between the anode electrode 20EA or the cathode electrode 20EK and the bump electrode 33 is irradiated with the laser LZ to heat the contact portion. In this manner, the solder contained in the bump electrode 33 is bonded to the anode electrode 20EA or the cathode electrode 20EK.

Note that, before the present step, a solder film may be previously formed on the anode electrode 20EA and the cathode electrode 20EK of the LED element 20. In this case, the bump electrode 33 containing the solder and the solder film formed on the electrode can be easily unified, and therefore, the bump electrode 33 and the cathode electrode 20EK (or the anode electrode 20EA) can be reliably connected together.

As shown in FIG. 14, if some of the plurality of contact portions at which the plurality of bump electrodes 33 and the electrodes of the plurality of LED elements 20 are in contact with each other are selectively irradiated with the laser LZ, the range of irradiation with the laser LZ can be reduced. For example, as shown in FIG. 14, if a circuit component 35 (for example, the line VL, the switching element SW, or the like shown in FIG. 3 is equivalent to the circuit component 35) is arranged between the bump electrodes 33 adjacent to each other, reducing the range of irradiation with the lase LZ can reduce the thermal influence of the laser LZ on the circuit component 35.

Note that FIG. 14 shows an example in which the laser LZ having a narrow range of irradiation is emitted from a small laser source LZS. However, a method of reducing the range of irradiation with the laser LZ has various modification examples. For example, the range of irradiation with the laser LZ can be narrowed when a part of a light shielding film not illustrated is provided with an opening that can transmit the laser LZ.

The present step is performed in a state in which the electrodes (the anode electrode 20EA and the cathode electrode 20EK) of the LED element 20 and the bump electrodes 33 are in contact with each other. The state of contact between the electrodes of the LED element 20 and the bump electrodes 33 is accurately controlled by the plurality of protrusions 74 as described above. Therefore, according to the present embodiment, the reliability of the electrical connection between the electrodes of the LED element 20 and the bump electrodes 33 can be improved.

Note that the case of the example shown in FIG. 14 shows that each of the plurality of LED elements 20 is sequentially irradiated with the laser LZ. However, in a modification example, a small number that is three or less of the LED elements 20 such as each two, each three or others of them may be collectively irradiated with the laser LZ.

Figure 15:
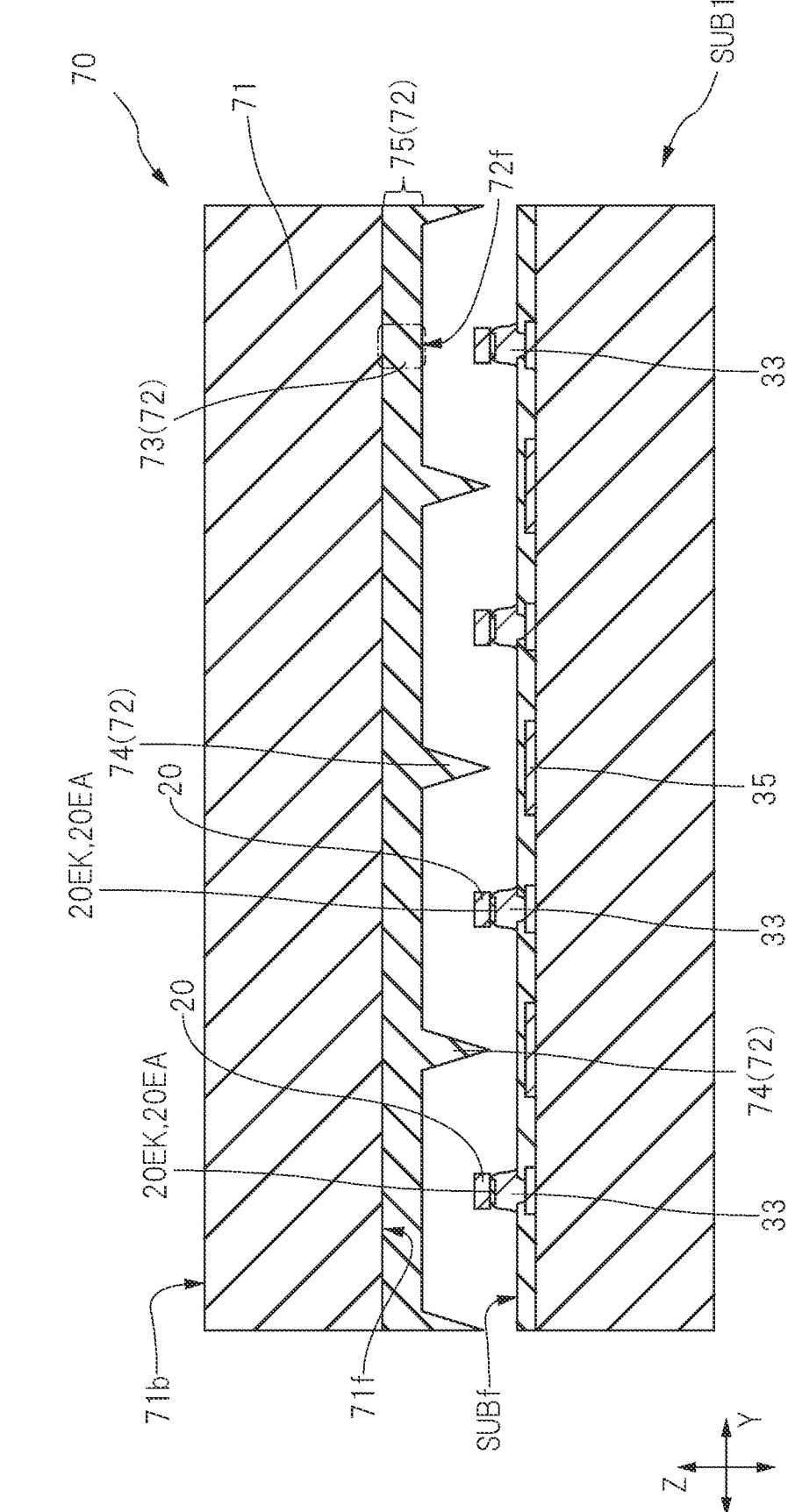
FIG. 15 is an enlarged cross-sectional view showing a state of the plurality of elements shown in FIG. 14 and the element holding portions being separated from each other.

Next, at the step of separating the element shown in FIG. 6, as shown in FIG. 15, the plurality of LED elements 20 and the element holding surfaces 72*f* of the element holding portions 73 of the plurality of elastic deformation portions 72 are separated from each other. FIG. 15 is an enlarge cross-sectional view showing a state in which the plurality of elements and the element holding portions shown in FIG. 14 are separated from each other.

At the present step, the substrate for transfer 70 and the substrate structure body SUB1 are brought away from each other. The electrodes of the plurality of LED elements 20 at this time are joined to the bump electrodes 33. In other words, the plurality of LED elements 20 are mounted on the substrate structure body SUB1, and the fixing strength between the LED element 20 and the bump electrodes 33 is higher than the bonding strength between the LED element 20 and the element holding portion 73 of the elastic deformation portion 72. Therefore, when the substrate for transfer 70 is lifted, the element holding surface 72*f* of the element holding portion 73 of the elastic deformation portion 72 and the LED element 20 is separated from each other at an interface.

Each of the plurality of protrusions 74 is made of an elastically deformable material as described above. Therefore, as shown in FIG. 15, once each of the plurality of protrusions 74 is separated from the substrate structure body SUB1, the shape of the protrusion 74 returns to its original shape (for example, the conical or pyramidal shape).

By each of the above-described steps, the substrate structure body SUB1 having the electrode of the LED element 20 joined to each of the plurality of bump electrodes 33 is acquired (a step of acquiring the electronic device).

Modification Example

Figure 16:
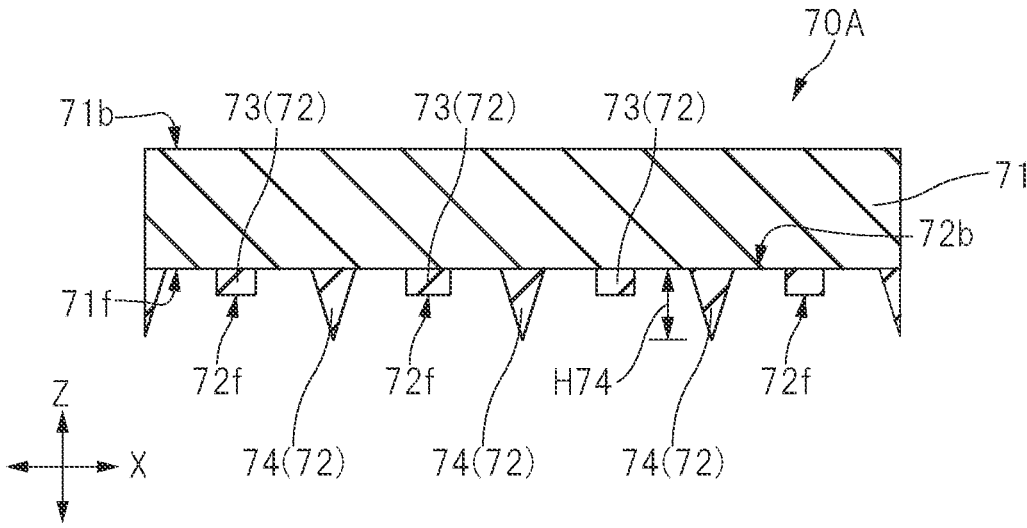
FIG. 16 is an enlarged cross-sectional view showing a modification example of FIG. 9.
Figure 17:
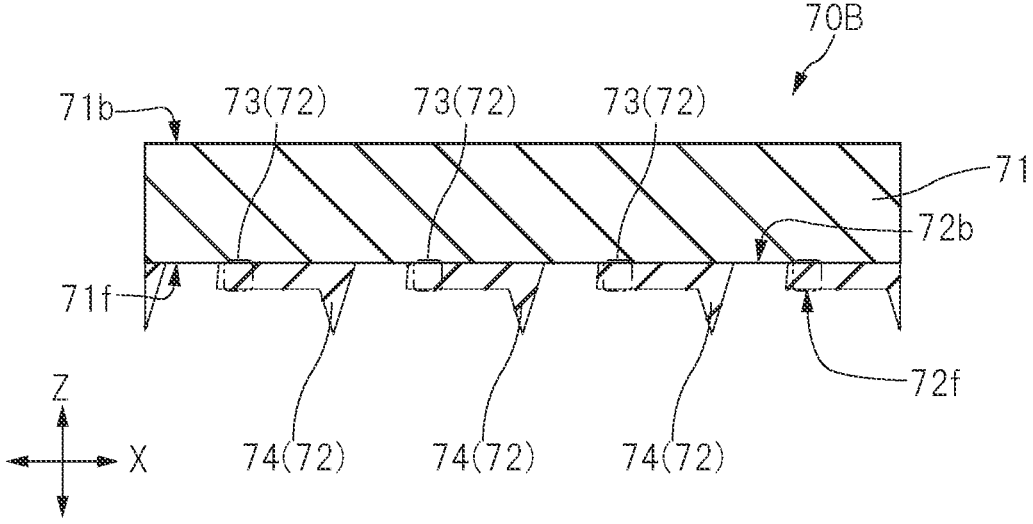
FIG. 17 is an enlarged cross-sectional view showing another modification example of FIG. 9.

Next, modification examples of the elastic deformation portion shown in FIG. 9 and modification examples of the method of manufacturing the electronic device using these modification examples of the elastic deformation portion will be described. FIG. 16 is an enlarged cross-sectional view showing a modification example of FIG. 9. FIG. 17 is an enlarged cross-sectional view showing another modification example of FIG. 9. Note that the following description is mainly made for differences from the substrate for transfer 70 described with reference to FIGS. 8 to 14 and from the method of manufacturing the electronic device using this substrate for transfer 70, and repetitive description for the common points is omitted.

A substrate for transfer 70A shown in FIG. 16 and a substrate for transfer 70B shown in FIG. 17 are both different from the substrate for transfer 70 shown in FIG. 9 in that they do not have the base portion 75 shown in FIG. 9. In both the cases of the substrate for transfer 70A and the substrate for transfer 70B, the plurality of element holding portions 73 are bonded to the substrate 71 while being spaced from each other. As described with reference to FIG. 14, in the case of a system of selectively irradiating some of the plurality of LED elements with the laser LZ at the laser irradiation step, the elastic deformation portion 72 may be shrunk by the thermal influence during the laser irradiation. At this time, if the plurality of element holding portions 73 are connected to each other via the base portion 75 as shown in FIG. 9, it is conceivable that the positional relation between the LED element 20 arranged in the vicinity of the LED element 20 irradiated with the laser LZ (see FIG. 14) and the bump electrodes 33 is misaligned by the thermal shrinkage of the base portion 75.

On the other hand, in both the cases of the substrate for transfer 70A shown in FIG. 16 and the substrate for transfer 70B shown in FIG. 17, the plurality of element holding portions 73 are bonded to the substrate 71 while being spaced from each other. Therefore, even if some of the plurality of LED elements 20 are selectively irradiated with laser at the laser irradiation step, the misalignment of the positional relation between the other LED elements 20 and the bump electrodes 33 due to the thermal shrinkage can be prevented.

The substrate for transfer 70B shown in FIG. 17 is different from the substrate for transfer 70A shown in FIG. 16 in that the element holding portion 73 and one or more of the protrusions 74 are unified. Even in the case of the example shown in FIG. 17, the plurality of element holding portions 73 are spaced from each other. Therefore, even if some of the plurality of LED elements 20 are selectively irradiated with laser at the laser irradiation step, the misalignment of the positional relation between the other LED elements 20 and the bump electrodes 33 due to the thermal shrinkage can be prevented.

In addition, in the case of the substrate for transfer 70B shown in FIG. 17, since the element holding portion 73 and one or more of the protrusions 74 are unified, a bonding area between the element holding portion 73 and the substrate 71 can be made larger than in the case of the substrate for transfer 70A shown in FIG. 16. The substrate for transfer 70 shown in FIG. 9, the substrate for transfer 70A shown in FIG. 16, and the substrate for transfer 70B shown in FIG. 17 are all tools for transferring the plurality of LED elements 20 to the substrate structure body SUB1 shown in FIG. 11. Therefore, as described with reference to FIG. 15, after the electrodes of the LED element 20 and the bump electrodes 33 are joined together, the element holding portion 73 and the LED element 20 are separated from each other at the step of separating the element.

At this time, if the bonding strength between the substrate 71 and the element holding portion 73 is weak, a bonding portion between the substrate 71 and the element holding portion 73 may be separated from each other, and there is concern about the element holding portion 73 is bonded to the LED element 20 to be left. In the case of the substrate for transfer 70B shown in FIG. 17, since the element holding portion 73 and the protrusion 74 are unified, the bonding strength between the substrate 71 and the element holding portion 73 can be improved. Therefore, the phenomenon of separating the bonding portion between the substrate 71 and the element holding portion 73 can be suppressed.

In the case of the example shown in FIG. 16, the height H74 of the protrusion 74 is defined as a height from the surface 71*f* of the substrate 71 to the apex of the protrusion 74. In this case, the height H74 of the protrusion 74 shown in FIG. 16 is preferably within the following range. That is, the height H74 of the protrusion 74 is preferably equal to or more than the sum of the thickness T20 of the LED element 20, the height H33 of the bump electrode 33 shown in FIG. 12, and the thickness of the element holding portion 73 shown in FIG. 16. In addition, the height H74 of the protrusion 74 is preferably equal to or less than "5 μm+the sum of the thickness T20 of the LED element 20, the height H33 of the bump electrode 33, and the thickness of the element holding portion 73". Note that the definition of the height H33 of the bump electrode 33 shown in FIG. 7 and the definition of the thickness T20 of the LED element 20 shown in FIG. 12 are as described above. In addition, the thickness of the element holding portion 73 is defined as a distance from the surface 71*f* of the substrate 71 to the element holding surface 72*f* of the element holding portion 73.

In the case of the modification examples shown in FIGS. 16 and 17, the plurality of element holding portions 73 can be interpreted as follows. Each of the plurality of element holding portions 73 includes an element support portion (a main body of the element holding portion 73) protruding lower than each of the plurality of protrusions 74 when the surface 71*f* of the substrate 71 is a reference plane, and an element holding surface 72*f* arranged at a tip of the element support portion and capable of holding the element.

Figure 18:
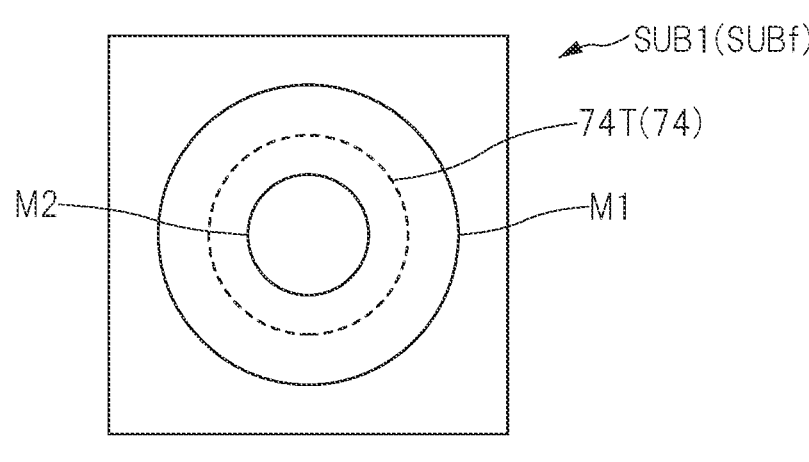
FIG. 18 is an enlarged plan view showing an example of a pattern displayed on a bump array surface side of the substrate structure body shown in FIG. 11.
Figure 18:
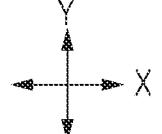
Figure 19:
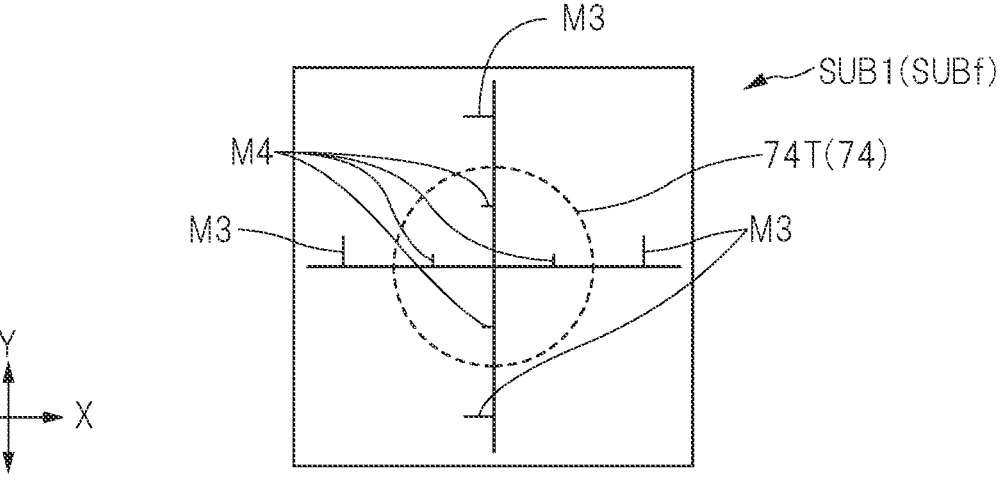
FIG. 19 is an enlarged plan view showing a modification example of FIG. 18.

FIG. 18 is an enlarged plan view showing an example of a pattern displayed on a bump array surface side of the substrate structure body shown in FIG. 11. FIG. 19 is an enlarged plan view showing a modification example of FIG. 18. In addition, in another modification example, a mark for measurement for enabling easy measurement of the size of the contour of the tip 74T of the protrusion 74 may be formed on the surface SUBf of the substrate structure body SUB1 as shown in FIG. 18. For example, in the example shown in FIG. 18, two circular marks are formed on the surface SUBf of the substrate structure body SUB1 concentrically around a contact portion with the tip 74T of the protrusion 74. The larger circle is an upper limit mark M1 indicating the upper limit of the contour of the tip 74T, and the smaller circle is a lower limit mark M2 indicating the lower limit of the contour of the tip 74T. In the case of the example shown in FIG. 18, the force of pressing the substrate for transfer 70 (see FIG. 11) is adjusted so that the contour of the tip 74T of the protrusions 74 is located between the upper limit mark M1 and the lower limit mark M2.

For example, in the example shown in FIG. 19, two straight lines crossing at the center of the contact portion with the tip 74T of the protrusion 74 are formed on the surface SUBf of the substrate structure body SUB1. One of the two straight lines extends in the X direction, and the other extends in the Y direction perpendicular to the X direction. In addition, the straight line extending in the X direction has two upper limit marks M3 and two lower limit marks M4 formed thereon. Similarly, the straight line extending in the Y direction has two upper limit marks M3 and two lower limit marks M4 formed thereon. Distances from the four upper limit marks M3 to the cross point between the two straight lines are equal to one another. In addition, distances from the four lower limit marks M4 to the cross point between the two straight lines are equal to one another. In the case of the example shown in FIG. 19, the force of pressing the substrate for transfer 70 (see FIG. 11) is adjusted so that the contour of the tip 74T of the protrusion 74 is located between the upper limit marks M3 and the lower limit marks M4.

According to the examples shown in FIGS. 18 and 19, the upper and lower limits of the contour of the tip 74T of the protrusion 74 can be easily recognized. Therefore, the distance between the substrate for transfer 70 and the substrate structure body SUB1 shown in FIG. 11, in other words, the state of contact between the electrodes (the anode electrode 20EA and the cathode electrode 20EK) of the LED element 20 and the bump electrodes 33 can be easily accurately adjusted.

The embodiments and typical modification examples have been described above. The above-described technique is also applicable to various modification examples other than the exemplified modification examples. For example, the above-described modification examples may be combined with each other.

In the scope of the concept of the present invention, various modification examples and alteration examples could have been easily anticipated by those who are skilled in the art, and it would be understood that these various modification examples and alteration examples are within the scope of the present invention. For example, the ones obtained by appropriate addition, removal, or design-change of the components to/from/into each of the above-described embodiments by those who are skilled in the art or obtained by addition, omitting, or condition-change of the step to/from/into each of the above-described embodiments are also within the scope of the present invention as long as they include the concept of the present invention.

The present invention is applicable to a display device and an electronic device into which the display device is embedded.

What is claimed is:

1. A method of manufacturing an electronic device, comprising steps of:
   (a) preparing a substrate for element transfer including a first substrate having a first surface, and an elastic deformation portion fixed on the first surface of the first substrate and made of an elastically deformable material;
   (b) bonding a plurality of elements and a plurality of element holding portions of the elastic deformation portion of the substrate for element transfer to hold the plurality of elements by the substrate for element transfer;
   (c) preparing a second substrate having a second surface having a plurality of bump electrodes arranged thereon, and bringing the plurality of bump electrodes and electrodes of the plurality of elements held by the substrate for element transfer into contact with each other; and
   (d) irradiating with laser a plurality of contact portions at which the plurality of bump electrodes and the electrodes of the plurality of element are in contact with each other to bond the bump electrodes and the element electrodes irradiated with the laser,
   wherein the elastic deformation portion includes:
      the plurality of element holding portions; and
      a plurality of protrusions arranged at positions not overlapping with the plurality of element holding portions in a plan view, and protruding higher than the plurality of element holding portions when the first surface of the first substrate is a reference plane, and
   wherein at the step (c), the first substrate and the second substrate are brought close to each other until each of the plurality of protrusions of the elastic deformation portion is in contact with the second surface of the second substrate.

2. The method of manufacturing the electronic device according to claim 1,
   wherein each of the first substrate and the elastic deformation portion is made of a visible light transmitting material, and
   wherein at the step (c), each of tips of the plurality of protrusions is elastically deformed to adjust a spacing distance between the first substrate and the second substrate, based on a degree of the elastic deformation of the tips.

3. The method of manufacturing the electronic device according to claim 2, wherein each of the plurality of protrusions has a conical or pyramidal shape.

4. The method of manufacturing the electronic device according to claim 2, wherein two or more protrusions are arranged around each of the plurality of element holding portions in a plan view.

5. The method of manufacturing the electronic device according to claim 2, wherein each of the plurality of element holding portions includes:

an element support portion protruding lower than each of the plurality of protrusions when the first surface of the first substrate is the reference plane; and an element holding surface arranged at a tip of the element support portion and capable of holding the element.

6. The method of manufacturing the electronic device according to claim 5, wherein the plurality of element holding portions and the plurality of protrusions are bonded to the first substrate while being spaced from each other.

7. The method of manufacturing the electronic device according to claim 5, wherein the plurality of element holding portions are bonded to the first substrate while being spaced from each other, and wherein the plurality of element holding portions and one or more of the protrusions are unified.

\*    \*    \*    \*    \*